US008432322B2

(12) United States Patent
Amm et al.

(10) Patent No.: US 8,432,322 B2
(45) Date of Patent: Apr. 30, 2013

(54) ELECTRONIC DEVICES WITH CAPACITIVE PROXIMITY SENSORS FOR PROXIMITY-BASED RADIO-FREQUENCY POWER CONTROL

(75) Inventors: David T. Amm, Sunnyvale, CA (US); Robert W. Schlub, Campbell, CA (US); Omar S. Leung, Palo Alto, CA (US); Brian M. King, Santa Cruz, CA (US); Qingxiang Li, Mountain View, CA (US); Enrique Ayala Vazquez, Watsonville, CA (US); Rodney Andres Gomez Angulo, Sunnyvale, CA (US); Yi Jiang, Sunnyvale, CA (US); Ruben Caballero, San Jose, CA (US)

(73) Assignee: Apple Inc., Cupertino, CA (US)

( * ) Notice: Subject to any disclaimer, the term of this patent is extended or adjusted under 35 U.S.C. 154(b) by 414 days.

(21) Appl. No.: 12/632,695

(22) Filed: Dec. 7, 2009

(65) Prior Publication Data
US 2011/0012793 A1    Jan. 20, 2011

Related U.S. Application Data

(60) Provisional application No. 61/226,683, filed on Jul. 17, 2009.

(51) Int. Cl.
*H01Q 1/24* (2006.01)

(52) U.S. Cl.
USPC .............................. 343/702; 343/872; 324/658

(58) Field of Classification Search .................. 343/702, 343/872; 324/658
See application file for complete search history.

(56) References Cited

U.S. PATENT DOCUMENTS

| | | | |
|---|---|---|---|
| 5,337,353 | A | 8/1994 | Boie et al. |
| 5,463,406 | A | 10/1995 | Vannatta et al. |
| 5,650,597 | A | 7/1997 | Redmayne |

(Continued)

FOREIGN PATENT DOCUMENTS

| | | |
|---|---|---|
| DE | 102005035935 | 2/2007 |
| EP | 0 564 164 | 10/1993 |

(Continued)

OTHER PUBLICATIONS

U.S. Appl. No. 12/061,159, filed Apr. 2, 2008, Ligtenberg et al.

(Continued)

*Primary Examiner* — Dieu H Duong
(74) *Attorney, Agent, or Firm* — Treyz Law Group; G. Victor Treyz; Chih-Yun Wu

(57) ABSTRACT

An electronic device may have a housing in which an antenna is mounted. An antenna window may be mounted in the housing to allow radio-frequency signals to be transmitted from the antenna and to allow the antenna to receive radio-frequency signals. Near-field radiation limits may be satisfied by reducing transmit power when an external object is detected in the vicinity of the dielectric antenna window and the antenna. A capacitive proximity sensor may be used in detecting external objects in the vicinity of the antenna. The proximity sensor may have conductive layers separated by a dielectric. A capacitance-to-digital converter may be coupled to the proximity sensor by inductors. The capacitive proximity sensor may be interposed between an antenna resonating element and the antenna window. The capacitive proximity sensor may serve as a parasitic antenna resonating element and may be coupled to the housing by a capacitor.

19 Claims, 12 Drawing Sheets

U.S. PATENT DOCUMENTS

| | | | |
|---|---|---|---|
| 5,826,458 A | 10/1998 | Little | |
| 5,854,972 A | 12/1998 | Pennock et al. | |
| 5,864,316 A | 1/1999 | Bradley et al. | |
| 5,905,467 A | 5/1999 | Narayanaswamy et al. | |
| 5,956,626 A | 9/1999 | Kashke et al. | |
| 6,329,958 B1 | 12/2001 | McLean et al. | |
| 6,380,899 B1 | 4/2002 | Madsen et al. | |
| 6,408,193 B1 | 6/2002 | Katagishi et al. | |
| 6,456,856 B1 | 9/2002 | Werling et al. | |
| 6,529,088 B2 | 3/2003 | Lafleur et al. | |
| 6,590,539 B2 | 7/2003 | Shinichi | |
| 6,611,227 B1 | 8/2003 | Nebiyeloul-Kifle et al. | |
| 6,657,595 B1 | 12/2003 | Phillips et al. | |
| 6,678,532 B1 | 1/2004 | Mizoguchi | |
| 6,879,293 B2 * | 4/2005 | Sato | 343/702 |
| 6,978,121 B1 | 12/2005 | Lane et al. | |
| 6,985,113 B2 | 1/2006 | Nishimura et al. | |
| 7,016,686 B2 | 3/2006 | Spaling | |
| 7,039,435 B2 | 5/2006 | McDowell et al. | |
| 7,050,010 B2 | 5/2006 | Wang et al. | |
| 7,109,945 B2 | 9/2006 | Mori | |
| 7,113,087 B1 | 9/2006 | Casebolt | |
| 7,146,139 B2 | 12/2006 | Nevermann | |
| 7,499,722 B2 | 3/2009 | McDowell et al. | |
| 7,522,846 B1 | 4/2009 | Lewis et al. | |
| 7,557,760 B2 | 7/2009 | Chang et al. | |
| 7,633,076 B2 | 12/2009 | Huppi et al. | |
| 7,826,875 B2 | 11/2010 | Karaoguz et al. | |
| 7,834,813 B2 | 11/2010 | Caimi et al. | |
| 2002/0027474 A1 | 3/2002 | Bonds | |
| 2002/0094789 A1 | 7/2002 | Harano | |
| 2002/0123309 A1 | 9/2002 | Collier et al. | |
| 2003/0062907 A1 | 4/2003 | Nevermann | |
| 2003/0186728 A1 | 10/2003 | Manjo | |
| 2003/0197597 A1 | 10/2003 | Bahl et al. | |
| 2003/0210203 A1 | 11/2003 | Phillips et al. | |
| 2003/0218993 A1 | 11/2003 | Moon et al. | |
| 2004/0176083 A1 | 9/2004 | Shiao et al. | |
| 2004/0189542 A1 | 9/2004 | Mori | |
| 2004/0222926 A1 | 11/2004 | Kontogeorgakis et al. | |
| 2005/0245204 A1 | 11/2005 | Vance | |
| 2006/0161871 A1 | 7/2006 | Hotelling et al. | |
| 2006/0232468 A1 | 10/2006 | Parker et al. | |
| 2006/0244663 A1 | 11/2006 | Fleck et al. | |
| 2007/0188375 A1 | 8/2007 | Richards et al. | |
| 2008/0165063 A1 | 7/2008 | Schlub et al. | |
| 2008/0248837 A1 | 10/2008 | Kunkel | |
| 2008/0316120 A1 * | 12/2008 | Hirota et al. | 343/702 |
| 2009/0000023 A1 | 1/2009 | Wegelin et al. | |
| 2009/0096683 A1 | 4/2009 | Rosenblatt et al. | |
| 2009/0174611 A1 | 7/2009 | Schlub et al. | |
| 2009/0295648 A1 | 12/2009 | Dorsey et al. | |
| 2010/0167672 A1 | 7/2010 | Ahn et al. | |
| 2011/0012793 A1 | 1/2011 | Amm et al. | |
| 2011/0012794 A1 | 1/2011 | Schlub et al. | |
| 2011/0212746 A1 | 9/2011 | Sarkar et al. | |

FOREIGN PATENT DOCUMENTS

| | | | |
|---|---|---|---|
| EP | 1298809 | | 4/2003 |
| EP | 1 469 550 | | 10/2004 |
| EP | 1 524 774 | | 4/2005 |
| EP | 1564896 | | 8/2005 |
| GB | 2 380 359 | | 4/2003 |
| JP | 2003179670 | | 6/2003 |
| JP | 2003209483 | | 7/2003 |
| JP | 200667061 | | 3/2006 |
| JP | 2009032570 A | * | 2/2009 |
| WO | 0131733 | | 5/2001 |
| WO | 02/05443 | | 1/2002 |
| WO | 2005112280 | | 11/2005 |
| WO | 2007116790 | | 4/2006 |
| WO | 2008/078142 | | 7/2008 |
| WO | 2009022387 | | 2/2009 |
| WO | 2009149023 | | 12/2009 |

OTHER PUBLICATIONS

U.S. Appl. No. 11/969,684, filed Jan. 4, 2008, Schlub et al.
U.S. Appl. No. 12/110,260, filed Apr. 25, 2008, Sorenson et al.
U.S. Appl. No. 12/132,549, filed Jun. 3, 2008, Dorsey et al.
U.S. Appl. No. 12/632,697, filed Dec. 7, 2009, Schlub et al.
U.S. Appl. No. 12/207,326, filed Sep. 9, 2008, Caballero et al.
U.S. Appl. No. 12/422,196, filed Apr. 10, 2009, John G. Dorsey.
"CapTouch Programmable Controller for Single-Electrode Capacitance Sensors", AD7147 Data Sheet Rev. B, [online], Analog Devices, Inc., [retrieved on Dec. 7, 2009], <URL: http://www.analog.com/static/imported-files/data_sheets/AD7147.pdf>.
U.S. Appl. No. 12/759,243, filed Apr. 13, 2010, Schlub et al.
Myllmaki et al, "Capacitive recognition of the user's hand grip position in mobile handsets", Progress in Electromagnetics Research B, vol. 22, 2010, pp. 203-220.
Palace, Aleksander, et al. U.S. Appl. No. 12/861,640, filed Aug. 23, 2010.
Palace, Aleksander, U.S. Appl. No. 61/235,905, filed Aug. 21, 2009.
Leung, Omar S. et al. U.S. Appl. No. 12/257,956, filed Oct. 24, 2006.

* cited by examiner

ELECTRONIC DEVICES WITH CAPACITIVE PROXIMITY SENSORS FOR PROXIMITY-BASED RADIO-FREQUENCY POWER CONTROL

This application claims the benefit of provisional patent application No. 61/226,683, filed Jul. 17, 2009, which is hereby incorporated by reference herein in its entirety.

BACKGROUND

This relates generally to antennas, and, more particularly, to antennas for electronic devices.

Electronic devices such as portable computers and handheld electronic devices are becoming increasingly popular. Devices such as these are often provided with wireless communications capabilities. For example, electronic devices may use long-range wireless communications circuitry such as cellular telephone circuitry to communicate using cellular telephone bands at 850 MHz, 900 MHz, 1800 MHz, and 1900 MHz (e.g., the main Global System for Mobile Communications or GSM cellular telephone bands). Long-range wireless communications circuitry may also be used handle the 2100 MHz band and other bands. Electronic devices may use shortrange wireless communications links to handle communications with nearby equipment. For example, electronic devices may communicate using the WiFi® (IEEE 802.11) bands at 2.4 GHz and 5 GHz (sometimes referred to as local area network bands) and the Bluetooth® band at 2.4 GHz.

It can be difficult to incorporate antennas successfully into an electronic device. Some electronic devices are manufactured with small form factors, so space for antennas is limited. In many electronic devices, the presence of electronic components in the vicinity of an antenna serves as a possible source of electromagnetic interference. Antenna operation can also be blocked by conductive structures. This can make it difficult to implement an antenna in an electronic device that contains conductive housing walls or other conductive structures that can potentially block radio-frequency signals. Radio-frequency transmit power limits may be imposed by regulatory bodies. These limits pose challenges when operating an electronic device antenna at elevated power levels.

It would therefore be desirable to be able to provide improved antennas for wireless electronic devices.

SUMMARY

An electronic device such as a tablet computer or other portable device may have a conductive housing. A portion of the conductive housing in each device may serve as antenna ground for an antenna. The antenna may be fed using a positive antenna feed terminal coupled to an antenna resonating element and a ground antenna feed terminal coupled to the conductive housing.

The antenna resonating element may be mounted adjacent to an antenna window in the conductive housing. To ensure that desired maximum output power limits for radio-frequency signals are satisfied when an external object such as a human body is in the vicinity of the antenna window, the electronic device may be provided with a capacitive proximity sensor. The proximity sensor may have a capacitive proximity sensor electrode that is interposed between the antenna resonating element and the antenna window. During operation, the proximity sensor may detect when an external object such as part of a user's body comes within a given distance of the proximity sensor and the antenna. When these conditions are detected, circuitry in the electronic device may reduce the maximum transmitted output power through the antenna.

The capacitive proximity sensor electrode may have first and second conductive layers that are separated by a dielectric layer. First and second inductors may be used to couple the first and second conductive layers to respective first and second inputs of a signal detector such as a capacitance-to-digital converter.

The capacitive proximity sensor electrode may serve as a parasitic antenna resonating element for the antenna that helps to reduce radio-frequency signal hotspots. A capacitor may be used to connect the capacitive proximity sensor electrode to the conductive housing.

Further features of the invention, its nature and various advantages will be more apparent from the accompanying drawings and the following detailed description of the preferred embodiments.

DETAILED DESCRIPTION

Figure 1:
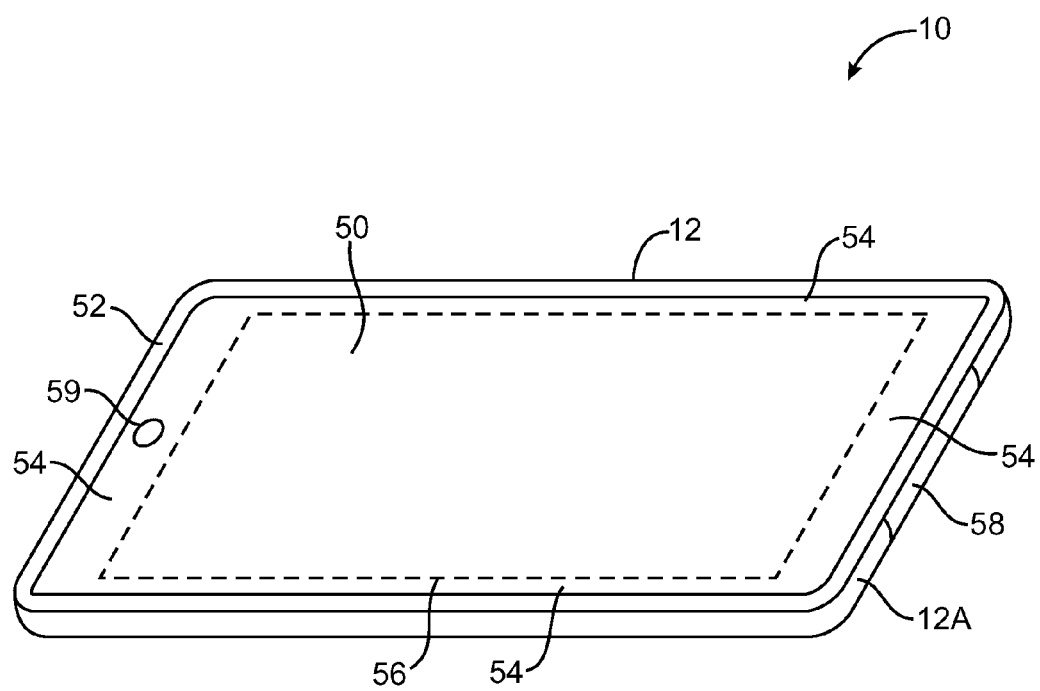
FIG. 1 is a front perspective view of an illustrative electronic device with an antenna and proximity sensor in accordance with an embodiment of the present invention.

Electronic devices may be provided with wireless communications circuitry. The wireless communications circuitry may be used to support wireless communications in one or more wireless communications bands. For example, the wireless communications circuitry may transmit and receive signals in cellular telephone bands.

To satisfy consumer demand for small form factor wireless devices, manufacturers are continually striving to reduce the size of components that are used in these devices while providing enhanced functionality. Particularly in configurations in which an electronic device is used in transmitting and receiving radio-frequency signals in cellular telephone bands and other communications bands that have relatively wide bandwidths, it can be challenging to meet desired antenna performance criteria in a compact device. High transmit powers and wide antenna bandwidths can be desirable to ensure adequate signal strength during communications, but these attributes may give rise to challenges with controlling emitted radiation levels.

It is generally impractical to completely shield a user of an electronic device from transmitted radio-frequency signals. For example, conventional cellular telephone handsets generally emit signals in the vicinity of a user's head during telephone calls. Government regulations limit radio-frequency signal powers. At the same time, wireless carriers require that the user equipment that is used in their networks be capable of producing certain minimum radio-frequency powers so as to ensure satisfactory operation of the equipment.

In many jurisdictions, specific absorption rate (SAR) standards are in place that impose maximum energy absorption limits on handset manufacturers. These standards place restrictions on the amount of radiation that may be emitted at any particular point within a given distance of the antenna. Particular attention is given to radiation limits at distances of about 1-20 mm from the device, where users are likely to place a body part near an antenna.

Satisfactory antenna performance and regulatory compliance can be ensured by using an antenna does not exhibit local "hotspots" in which emitted radiation exceeds desired power levels. A proximity sensor may also be used to detect when an external object such as a user's body is in the vicinity of the antenna. When the presence of the external object is detected, transmitted power levels can be reduced.

Hotspots can be minimized by proper antenna design. If desired, a parasitic antenna resonating element may be placed in the vicinity of a device antenna to help smooth out near-field emitted radiation patterns. Electromagnetic shielding arrangements may also be implemented using ferrite tape or other high permeability materials.

Any suitable electronic devices may be provided with antennas and proximity sensors that use these configurations. As an example, antennas and proximity sensors may be formed in electronic devices such as desktop computers, portable computers such as laptop computers and tablet computers, handheld electronic devices such as cellular telephones, etc. With one suitable configuration, which is sometimes described herein as an example, the antennas and proximity sensors are formed in relatively compact electronic devices in which interior space can be valuable. These compact devices may be portable electronic devices.

Portable electronic devices that may be provided with antennas and proximity sensors include laptop computers and small portable computers such as ultraportable computers, netbook computers, and tablet computers. Portable electronic devices may also be somewhat smaller devices. Examples of smaller portable electronic devices that may be provided with antennas include cellular telephones, wrist-watch devices, pendant devices, headphone and earpiece devices, and other wearable and miniature devices.

Space is at a premium in portable electronic devices and housings for these devices are sometimes constructed from conductive materials that block antenna signals. Arrangements in which antenna structures and proximity sensors are formed behind an antenna window can help address these challenges. Antenna windows may be formed in conductive housing walls by forming a dielectric antenna window structure from an opening in the conductive housing wall. If desired, slot-based antenna windows may be formed in conductive housing walls. In a slot-based antenna window, the window region is defined by a pattern of window slots. Arrangements in which dielectric antenna windows are used are sometimes described herein as an example.

An antenna resonating element may be formed under the antenna window. Portions of the conductive housing or other conductive structures may serve as antenna ground. The antenna can be fed using a positive antenna feed terminal that is coupled to the antenna resonating element and using a ground antenna feed terminal that is coupled to the conductive housing. During operation, radio-frequency signals for the antenna can pass through the antenna window. The parasitic antenna resonating element and ferrite tape may help to reduce near-field hotspots.

A proximity-based antenna power control circuit may be used to reduce near-field electromagnetic radiation intensities when the presence of an external object is detected in the vicinity of the antenna. The proximity-based antenna power control circuit may be based on a capacitive proximity sensor. Sensor electrodes for the capacitive proximity sensor may be placed in the vicinity of the antenna. If desired, a conductive structure such as a sensor electrode may serve both as part of a capacitive sensor and as part of a parasitic antenna resonating element. With this type of arrangement, the sensor electrode may be used in reducing near-field radiation hotspots while simultaneously serving as part of a capacitor electrode that detects the presence of nearby external objects for a proximity detector.

Antenna and proximity sensor structures with configurations such as these can be mounted on any suitable exposed portion of a portable electronic device. For example, antennas and proximity sensors can be provided on the front or top surface of the device. In a tablet computer, cellular telephone, or other device in which the front of the device is all or mostly occupied with conductive structures such as a touch screen display, it may be desirable to form at least part of an antenna window on a rear device surface. Other configurations are also possible (e.g., with antennas and proximity sensors mounted in more confined locations, on device sidewalls, etc.). The use of antenna mounting locations in which at least part of a dielectric antenna window is formed in a conductive rear housing surface is sometimes described herein as an example, but, in general, any suitable antenna mounting location may be used in an electronic device if desired.

An illustrative portable device that may include an antenna and proximity sensor is shown in FIG. 1. As shown in FIG. 1, device 10 may be a relatively thin device such as a tablet computer. Device 10 may have display such as display 50 mounted on its front (top) surface. Housing 12 may have curved portions that form the edges of device 10 and a relatively planar portion that forms the rear surface of device 10 (as an example). An antenna window such as antenna window 58 may be formed in housing 12. Antenna structures for device 10 may be formed in the vicinity of antenna window 58.

Device 10 may have user input-output devices such as button 59. Display 50 may be a touch screen display that is used in gathering user touch input. The surface of display 50 may be covered using a dielectric member such as a planar cover glass member. The central portion of display 50 (shown as region 56 in FIG. 1) may be an active region that is sensitive to touch input. The peripheral regions of display 50 such as regions 54 may be inactive regions that are free from touch sensor electrodes. A layer of material such as an opaque ink may be placed on the underside of display 50 in peripheral regions 54 (e.g., on the underside of the cover glass). This layer may be transparent to radio-frequency signals. The conductive touch sensor electrodes in region 56 may tend to block radio-frequency signals. However, radio-frequency signals may pass through the cover glass and opaque ink in inactive display regions (as an example). In the opposite direction, radio-frequency signals may pass through antenna window 58. Lower-frequency electromagnetic fields also pass through window 58, so capacitance measurements for a proximity sensor may be made through antenna window 58.

Housing 12 may be formed from one or more structures. For example, housing 12 may include an internal frame and planar housing walls that are mounted to the frame. Housing 12 may also be formed from a unitary block of material such as a cast or machined block of aluminum. Arrangements that use both of these approaches may also be used if desired.

Housing 12 may be formed of any suitable materials including plastic, wood, glass, ceramics, metal, or other suitable materials, or a combination of these materials. In some situations, portions of housing 12 may be formed from a dielectric or other low-conductivity material, so as not to disturb the operation of conductive antenna elements that are located in proximity to housing 12. In other situations, housing 12 may be formed from metal elements. An advantage of forming housing 12 from metal or other structurally sound conductive materials is that this may improve device aesthetics and may help improve durability and portability.

With one suitable arrangement, housing 12 may be formed from a metal such as aluminum. Portions of housing 12 in the vicinity of antenna window 58 may be used as antenna ground. Antenna window 58 may be formed from a dielectric material such as polycarbonate (PC), acrylonitrile butadiene styrene (ABS), a PC/ABS blend, or other plastics (as examples). Window 58 may be attached to housing 12 using adhesive, fasteners, or other suitable attachment mechanisms. To ensure that device 10 has an attractive appearance, it may be desirable to form window 58 so that the exterior surfaces of window 58 conform to the edge profile exhibited by housing 12 in other portions of device 10. For example, if housing 12 has straight edges 12A and a flat bottom surface, window 58 may be formed with a right-angle bend and vertical sidewalls. If housing 12 has curved edges 12A, window 58 may have a similarly curved surface.

Figure 2:
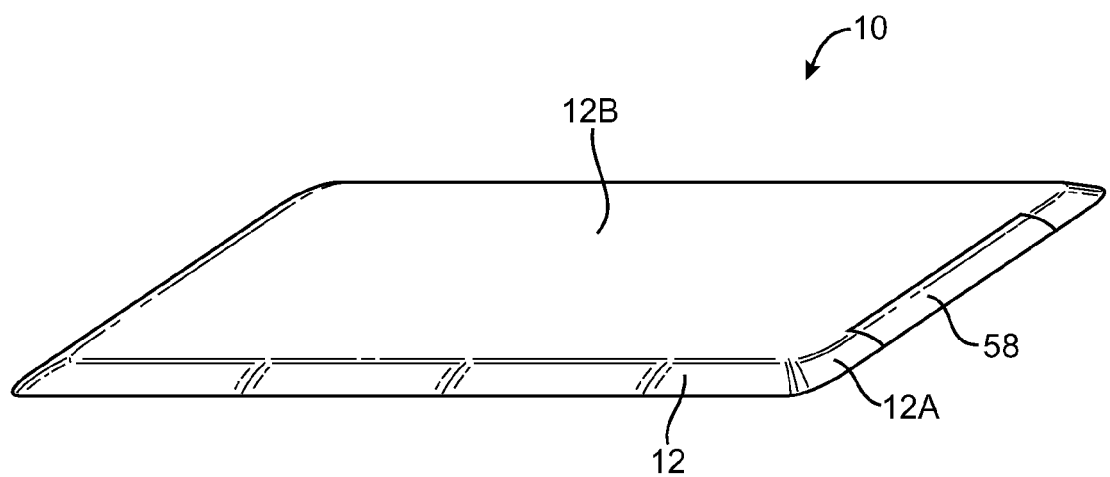
FIG. 2 is a rear perspective view of an illustrative electronic device with an antenna and proximity sensor in accordance with an embodiment of the present invention.

FIG. 2 is a rear perspective view of device 10 of FIG. 1 showing how device 10 may have a relatively planar rear surface 12B and showing how antenna window 58 may be rectangular in shape with curved portions that match the shape of curved housing edges 12A.

Figure 3:
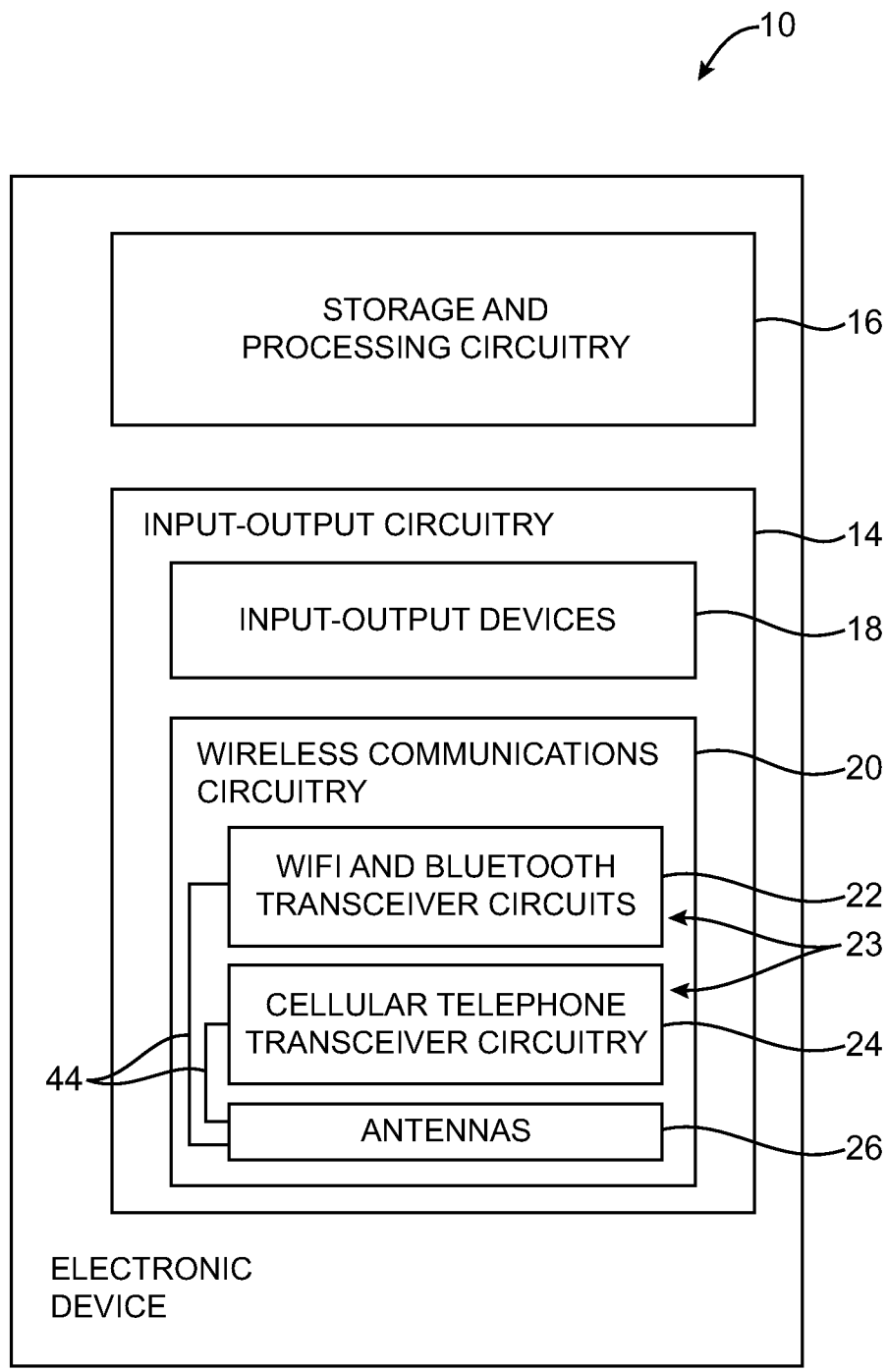
FIG. 3 is a schematic diagram of an illustrative electronic device with antenna and proximity sensor structures in accordance with an embodiment of the present invention.

A schematic diagram of device 10 showing how device 10 may include one or more antennas 26 and transceiver circuits that communicate with antennas 26 is shown in FIG. 3. Electronic device 10 of FIG. 3 may be a portable computer such as a laptop computer, a portable tablet computer, a mobile telephone, a mobile telephone with media player capabilities, a handheld computer, a remote control, a game player, a global positioning system (GPS) device, a desktop computer, a combination of such devices, or any other suitable electronic device.

As shown in FIG. 3, electronic device 10 may include storage and processing circuitry 16. Storage and processing circuitry 16 may include one or more different types of storage such as hard disk drive storage, nonvolatile memory (e.g., flash memory or other electrically-programmable-read-only memory), volatile memory (e.g., static or dynamic random-access-memory), etc. Processing circuitry in storage and processing circuitry 16 may be used to control the operation of device 10. Processing circuitry 16 may be based on a processor such as a microprocessor and other suitable integrated circuits. With one suitable arrangement, storage and processing circuitry 16 may be used to run software on device 10, such as internet browsing applications, voice-over-internet-protocol (VOIP) telephone call applications, email applications, media playback applications, operating system functions, control functions for controlling radio-frequency power amplifiers and other radio-frequency transceiver circuitry, etc. Storage and processing circuitry 16 may be used in implementing suitable communications protocols. Communications protocols that may be implemented using storage and processing circuitry 16 include internet protocols, cellular telephone protocols, wireless local area network protocols (e.g., IEEE 802.11 protocols—sometimes referred to as WiFi®), protocols for other short-range wireless communications links such as the Bluetooth® protocol, etc.

Input-output circuitry 14 may be used to allow data to be supplied to device 10 and to allow data to be provided from device 10 to external devices. Input-output devices 18 such as touch screens and other user input interface are examples of input-output circuitry 14. Input-output devices 18 may also include user input-output devices such as buttons, joysticks, click wheels, scrolling wheels, touch pads, key pads, keyboards, microphones, cameras, etc. A user can control the operation of device 10 by supplying commands through such user input devices. Display and audio devices may be included in devices 18 such as liquid-crystal display (LCD) screens, light-emitting diodes (LEDs), organic light-emitting diodes (OLEDs), and other components that present visual information and status data. Display and audio components in input-output devices 18 may also include audio equipment such as speakers and other devices for creating sound. If desired, input-output devices 18 may contain audio-video interface equipment such as jacks and other connectors for external headphones and monitors.

Wireless communications circuitry 20 may include radio-frequency (RF) transceiver circuitry 23 formed from one or more integrated circuits, power amplifier circuitry, low-noise input amplifiers, passive RF components, one or more antennas, and other circuitry for handling RF wireless signals. Wireless signals can also be sent using light (e.g., using infrared communications).

Wireless communications circuitry 20 may include radio-frequency transceiver circuits for handling multiple radio-frequency communications bands. For example, circuitry 20 may include transceiver circuitry 22 that handles 2.4 GHz and 5 GHz bands for WiFi (IEEE 802.11) communications and the 2.4 GHz Bluetooth communications band. Circuitry 20 may also include cellular telephone transceiver circuitry 24 for handling wireless communications in cellular telephone bands such as the GSM bands at 850 MHz, 900 MHz, 1800

MHz, and 1900 MHz, and the 2100 MHz data band (as examples). Wireless communications circuitry 20 can include circuitry for other short-range and long-range wireless links if desired. For example, wireless communications circuitry 20 may include global positioning system (GPS) receiver equipment, wireless circuitry for receiving radio and television signals, paging circuits, etc. In WiFi and Bluetooth links and other short-range wireless links, wireless signals are typically used to convey data over tens or hundreds of feet. In cellular telephone links and other long-range links, wireless signals are typically used to convey data over thousands of feet or miles.

Wireless communications circuitry 20 may include antennas 26 such as the antenna located adjacent to antenna window 58 of FIGS. 1 and 2. Antennas 26 may be single band antennas that each cover a particular desired communications band or may be multiband antennas. A multiband antenna may be used, for example, to cover multiple cellular telephone communications bands. If desired, a dual band antenna may be used to cover two WiFi bands (e.g., 2.4 GHz and 5 GHz). Different types of antennas may be used for different bands and combinations of bands. For example, it may be desirable to form a dual band antenna for forming a local wireless link antenna, a multiband antenna for handling cellular telephone communications bands, and a single band antenna for forming a global positioning system antenna (as examples).

Transmission line paths 44 may be used to convey radio-frequency signals between transceivers 22 and 24 and antennas 26. Radio-frequency transceivers such as radio-frequency transceivers 22 and 24 may be implemented using one or more integrated circuits and associated components (e.g., switching circuits, matching network components such as discrete inductors, capacitors, and resistors, and integrated circuit filter networks, etc.). These devices may be mounted on any suitable mounting structures. With one suitable arrangement, transceiver integrated circuits may be mounted on a printed circuit board. Paths 44 may be used to interconnect the transceiver integrated circuits and other components on the printed circuit board with antenna structures in device 10. Paths 44 may include any suitable conductive pathways over which radio-frequency signals may be conveyed including transmission line path structures such as coaxial cables, microstrip transmission lines, etc.

Antennas 26 may, in general, be formed using any suitable antenna types. Examples of suitable antenna types for antennas 26 include antennas with resonating elements that are formed from patch antenna structures, inverted-F antenna structures, closed and open slot antenna structures, loop antenna structures, monopoles, dipoles, planar inverted-F antenna structures, hybrids of these designs, etc. With one suitable arrangement, which is sometimes described herein as an example, part of housing 12 (e.g., the portion of housing 12 in the vicinity of antenna window 58) may form a ground structure for the antenna associated with window 58.

Figure 4:
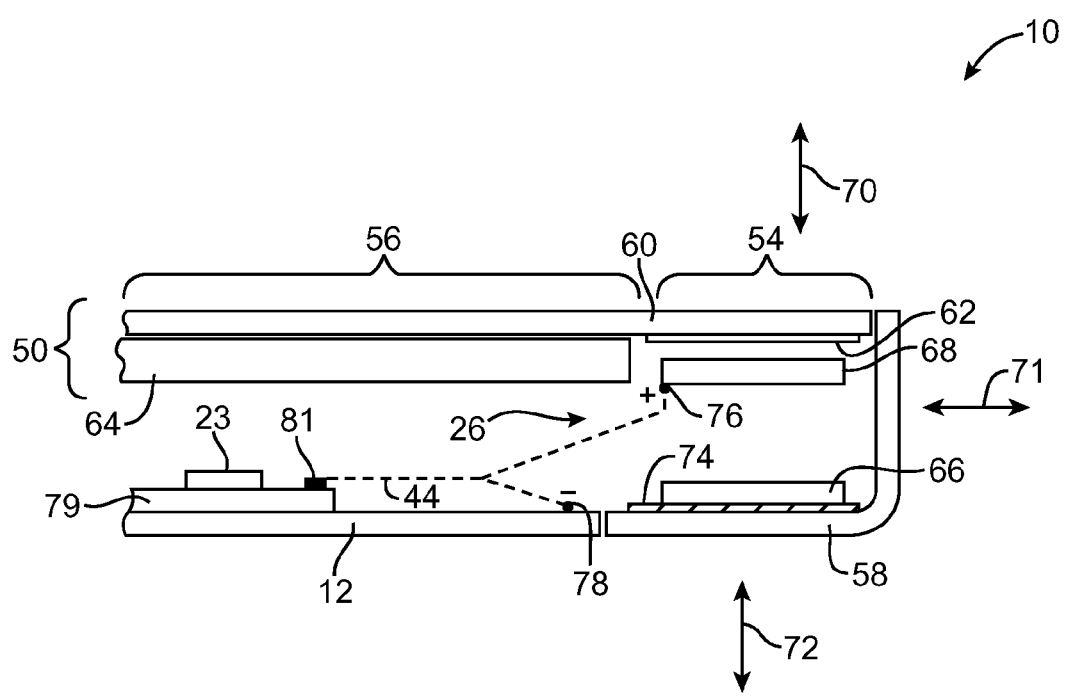
FIG. 4 is a cross-sectional side view of an illustrative electronic device with an antenna and proximity sensor in accordance with an embodiment of the present invention.

A cross-sectional view of device 10 in the vicinity of antenna window 58 is shown in FIG. 4. As shown in FIG. 4, antenna 26 may have antenna resonating element 68 (e.g., a patch antenna resonating element, a single arm inverted-F antenna structure, a dual-arm inverted-F antenna structure, or other suitable multi-arm or single arm inverted-F antenna structures, closed and open slot antenna structures, loop antenna structures, monopoles, dipoles, planar inverted-F antenna structures, hybrids of these designs, etc. Housing 12 may serve as antenna ground for antenna 26.

Antenna 26 may also have a parasitic antenna resonating element formed from one or more conductive structures such as structure 66. Structure 66 may include, for example, a capacitive proximity sensor electrode. If desired, a layer of ferrite material such as ferrite tape 74 may be placed between antenna resonating element 68 and window 58 to help reduce near-field signal strengths without over-attenuating far-field signals. In the example of FIG. 4, ferrite tape 74 has been placed under structure 66.

As shown in FIG. 4, antenna 26 may be fed using a positive antenna feed terminal that is coupled to antenna resonating element 68 such as positive antenna feed terminal 76 and a ground antenna feed terminal that is coupled to housing 12 such as ground antenna feed terminal 78.

Antenna resonating element 68 may be placed in the vicinity of dielectric antenna window 58 as shown in FIG. 4, so that radio-frequency signals can be conveyed through window 58 (e.g., in directions 72 and 71). Radio-frequency signals can also be conveyed through a transparent display cover member such as cover glass 60. Display 50 may have an active region such as region 56 in which cover glass 60 has underlying conductive structure such as display panel module 64. The structures in display panel 64 such as touch sensor electrodes and active display pixel circuitry may be conductive and may therefore attenuate radio-frequency signals. In region 54, however, display 50 may be inactive (i.e., panel 64 may be absent). An opaque ink such as ink 62 may be formed on the underside of transparent cover glass 60 in region 54 to block antenna resonating element 68 from view. Ink 62 and the dielectric material of cover member 60 in region 54 may be sufficiently transparent to radio-frequency signals that radio-frequency signals can be conveyed through these structures in directions 70.

Any suitable conductive materials may be used in forming antenna structures for antenna 26. With one suitable arrangement, the conductive structures for antenna resonating element 68 and parasitic antenna resonating element 66 may each be formed from conductive traces on a dielectric support. The conductive traces may be formed from copper or other metals (as an example) to help ensure low losses and good performance at radio frequencies. The dielectric supports for these structures may be printed circuit boards or plastic members. Plastic support structures may also be used to support printed circuit boards. In general, printed circuit boards may be rigid or flexible. Rigid printed circuit boards may be formed from epoxy (e.g., FR4) or other dielectric substrates. Flexible printed circuit boards ("flex circuits") may be formed from flexible polymer sheets such as polyimide sheets or other flexible dielectrics. When an antenna structure is formed from a sheet of flex circuit substrate, the flex circuit may, if desired, be flexed to form a curved surface (e.g., to adapt to a curved plastic support structure). With rigid substrate arrangements, the printed circuit board is typically flat.

Structures such as conductive structure 66 may serve multiple functions. For example, because structure 66 is adjacent to antenna resonating element 68, structure 66 influences the electromagnetic behavior of antenna 26 and can therefore serve as a parasitic antenna resonating element. At the same time, conductive structure 66 may, if desired, be used as a sensor electrode for a proximity sensor.

Transceiver circuitry 23 may be mounted to printed circuit board 79 and may be connected to the conductive lines in transmission line 44 via connector 81 and traces in board 79. Transmission line 44 may have positive and ground conductors and may be used in conveying radio-frequency antenna signals between transceiver 23 and feed terminals 76 and 78 of antenna 26.

Device 10 and antenna window 58 may have any suitable dimensions. For example, device 10 may have lateral dimensions of about 10-50 cm. Device 10 may be more than 2 cm thick, less than 2 cm thick, less than 1.5 cm thick, or less than 0.5 cm thick.

In thin device configurations, the removal of conductive housing portions in the immediate vicinity of antenna resonating element 68 helps ensure that antenna 26 will exhibit satisfactory efficiency and bandwidth (e.g., for supporting communications in wide bandwidth long-range communications bands such as cellular telephone communications bands).

Figure 5:
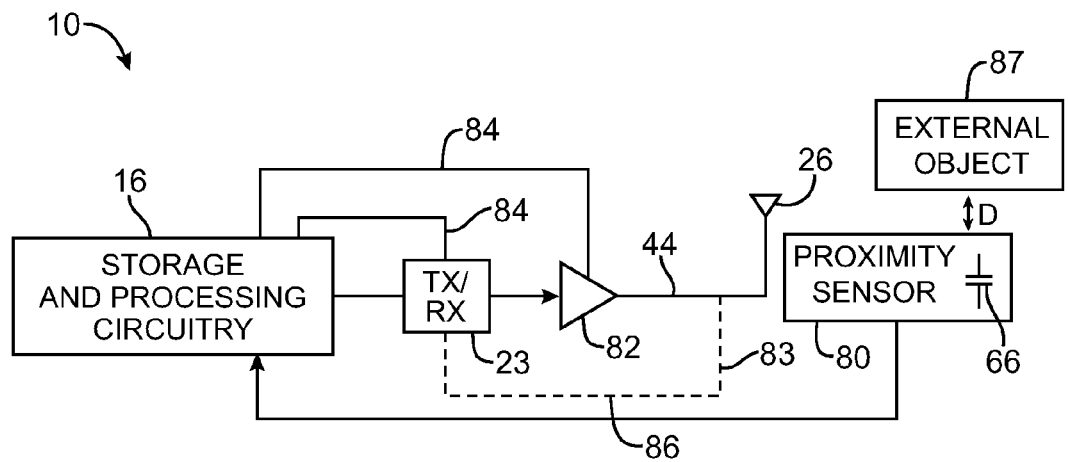
FIG. 5 is a diagram of an illustrative electronic device having an antenna and wireless circuitry that may reduce the amount of power transmitted through the antenna when a proximity sensor detects that an external object is within a given range of the antenna and the electronic device in accordance with an embodiment of the present invention.

A circuit diagram showing how a proximity sensor signal may be used in controlling the amount of power that is transmitted by antenna 26 is shown in FIG. 5. As shown in FIG. 5, device 10 may include storage and processing circuitry 16 (see, e.g., FIG. 3). Device 10 may also include a proximity sensor such as proximity sensor 80. Proximity sensor 80 may be implemented using any suitable type of proximity sensor technology (e.g., capacitive, optical, etc.). An advantage of capacitive proximity sensing techniques is that they can be relatively insensitive to changes in the reflectivity of external object 87.

As shown in the example of FIG. 5, proximity sensor 80 may contain a capacitor electrode formed from a conductive member such as conductive member 66 (FIG. 4). Conductive member 66 may, if desired, serve as a parasitic antenna resonating element for antenna 26.

Proximity sensor 80 may be mounted in housing 12 in the vicinity of antenna 26 (as shown in FIG. 4) to ensure that the signal from proximity sensor 80 is representative of the presence of external object 87 in the vicinity of antenna 26 (e.g., within a distance D of antenna 26 and/or device 10).

Output signals from proximity sensor 80 may be conveyed to storage and processing circuitry 16 using path 86. The signals from proximity sensor 80 may be analog or digital signals that provide proximity data to storage and processing circuitry 16. The proximity data may be Boolean data indicating that object 87 is or is not within a given predetermined distance of antenna 26 or may be continuous data representing a current estimated distance value for D.

Storage and processing circuitry 16 may be coupled to transceiver circuitry 23 and power amplifier circuitry 82. Dashed line 83 shows how received radio-frequency signals can be conveyed from antenna 26 to transceiver circuitry 23. During data transmission operations, control lines 84 may be used to convey control signals from storage and processing circuitry 16 to transceiver circuitry 23 and power amplifier circuitry 82 to adjust output powers in real time. For example, when data is being transmitted, transceiver 23 and is associated output amplifier 82 can be directed to increase or decrease the power level of the radio-frequency signal that is being provided to antenna 26 over transmission line 44 to ensure that regulatory limits for electromagnetic radiation emission are satisfied. If, for example, proximity sensor 80 does not detect the presence of external object 87, power can be provided at a relatively high (unrestricted) level. If, however, proximity sensor 80 determines that the user's leg or other body part or other external object 87 is in the immediate vicinity of antenna 26 (e.g., within 20 mm or less, within 15 mm or less, within 10 mm or less, etc.), storage and processing circuitry can respond accordingly by directing transceiver circuitry 23 and/or power amplifier 82 to transmit radio-frequency signals through antenna 26 at reduced powers.

Figure 6:
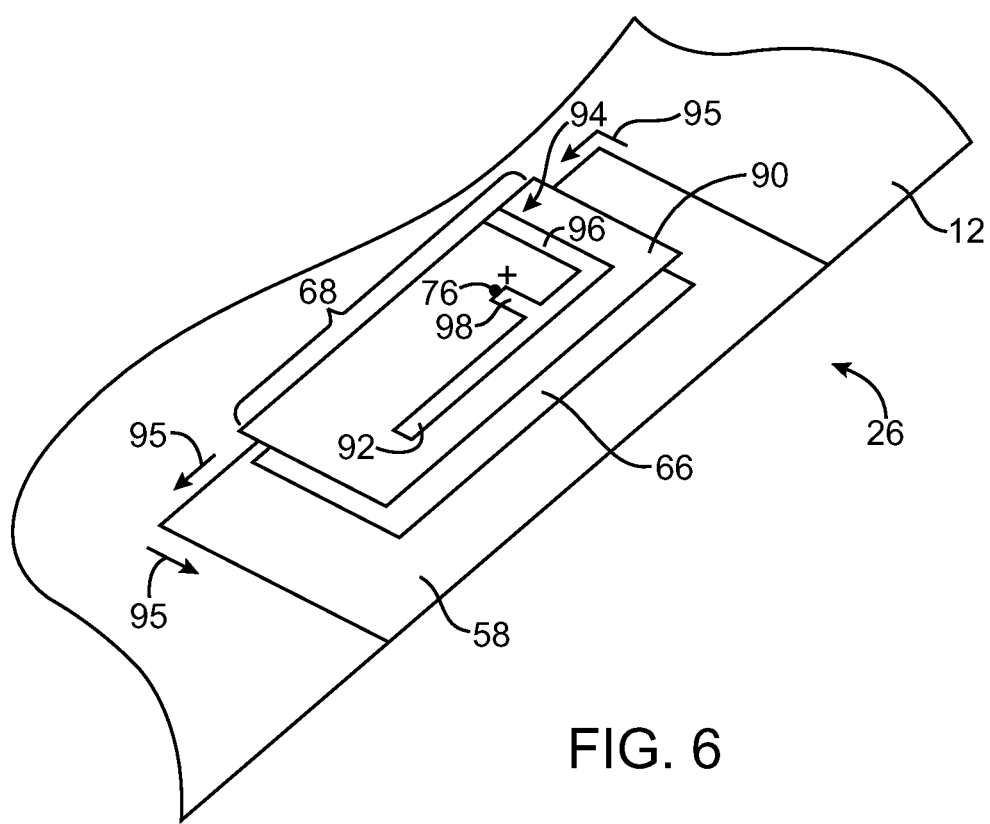
FIG. 6 is a perspective view of an illustrative antenna having an antenna resonating element and a proximity sensor electrode serving as a parasitic antenna resonating element that overlap a dielectric antenna window in accordance with an embodiment of the present invention.

A perspective view of an illustrative antenna 26 is shown in FIG. 6. As shown in FIG. 6, antenna resonating element 68 may contain one or more conductive traces such as conductive trace 96. In the example of FIG. 6, antenna resonating element 68 has an inverted-F configuration. With this configuration, antenna resonating element 68 may have a dielectric substrate such as rigid or flexible printed circuit substrate 90 on which a conductive pattern has been formed such as conductive trace 94. Conductive trace 94 may have a main resonating element arm 92, a short circuit branch such as branch 96 that shorts arm 92 to ground (e.g., a path coupled to antenna feed terminal 78 of FIG. 4), and a branch 98 to which positive antenna feed terminal 76 is coupled. Arm 92 may, if desired, be provided with different shapes (e.g., multiple branches) to support operation in desired communications bands with desired bandwidths. The trace pattern for antenna resonating element 68 that is shown in FIG. 6 is merely illustrative. In general, any suitable type of antenna resonating element pattern may be used for antenna resonating element 68 if desired.

Antenna resonating element 68 may be mounted so as to overlap antenna window 58 and so as to lie under inactive region 54 of display 50 (FIG. 4). Conductive structure 66 may be interposed between antenna resonating element 68 and window 58.

During operation of antenna 26, the electromagnetic fields that are produced by antenna resonating element 68 may induce currents in conductive housing 12, such as currents 95 in the vicinity of window 58. If care is not taken, the relative shapes and sizes of the components of antenna 26 may give rise to undesirable concentrations of currents. This can, in turn, lead to undesirable hotspots in the near-field radiation pattern for antenna 26, as the induced currents re-radiate electromagnetic energy through antenna window 58.

Figure 7:
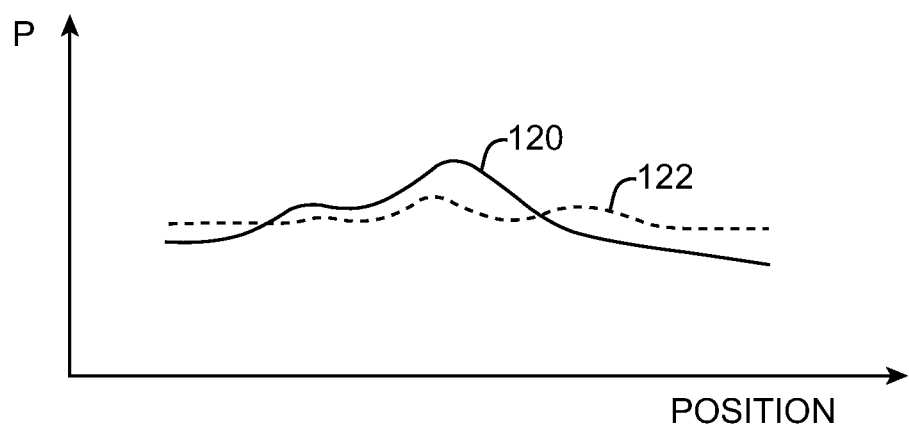
FIG. 7 is a graph showing how the presence of a parasitic antenna resonating element may help to reduce radio-frequency signal hotspots and thereby reduce near field radiation hotspots produced by an antenna in an electronic device in accordance with an embodiment of the present invention.

A graph that illustrates how antenna signals may exhibit undesirable hotspots is shown in FIG. 7. In the graph of FIG. 7, the power associated with near-field transmitted radio-frequency signals (e.g., signals for an antenna 26 that have been emitted in direction 72 or 71 through antenna window 58) is shown as a function of position (e.g., position along the inner edge of antenna window 58). Solid line 120 corresponds to a possible near-field radiation pattern in the absence of suitable antenna structures to reduce hotspots in currents 95 and associated hotspots in emitted radio-frequency signal powers. Dashed line 122 shows how hotspots can minimized or eliminated by inclusion of proper hotspot-reducing structures. Because dashed line 122 is smoother than line 120 and exhibits lower peak powers, dashed line 122 reflects a reduced spatial concentration of radio-frequency signal power. Smoothed radiation characteristics help antenna 26 to transmit desired amounts of signal power when communicating with a remote base station without exceeding regulatory limits for emitted radiation levels.

The near-field radiation pattern smoothing structures may include structures such as parasitic antenna resonating element 66. Ferrite tape 74 may also help to reduce hotspots and/or near-field signal intensities while allowing desired far-field antenna efficiency criteria to be satisfied. Proximity-sensor-based adjustments may be used in conjunction with these techniques if desired.

Parasitic antenna resonating element 66 may be formed from one or more conductive structures. For example, parasitic antenna resonating element 66 may be formed from a rectangular (patch) structure, a straight or bend elongated structure, a structure with a notch, a structure with a curve, other suitable shapes, and combinations of these shapes. Some or all of these structures may serve as capacitive proximity sensor electrodes.

Figure 8:
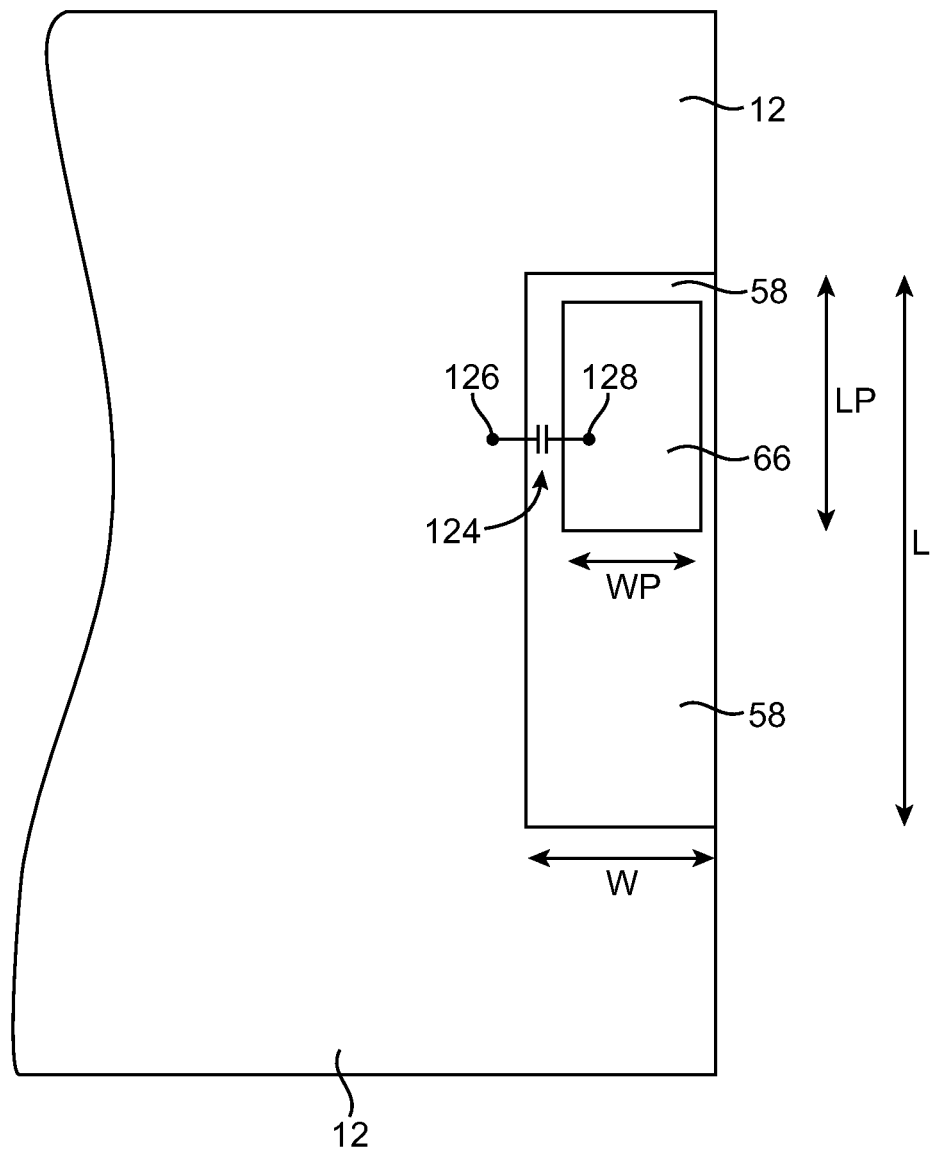
FIG. 8 is a top view of a parasitic antenna resonating element such as a capacitive proximity sensor electrode that has been coupled by a capacitor to a portion of a conductive device housing that is serving as antenna ground in accordance with an embodiment of the present invention.

FIG. 8 is a top view of parasitic antenna resonating element 66 in which the parasitic antenna resonating element is formed from a substantially rectangular conductive member (e.g., a rectangular patch). The patch may have lateral dimensions of LP and WP. Any suitable sizes may be used for dimensions LP and WP if desired. As an example, LP may be about 40 mm (e.g., 10-70 mm) and WP may be about 15 mm (e.g., about 5-25 mm). The outline of antenna window 58 may also be rectangular and may have any suitable dimensions. For example, the outline of antenna window 58 may have lateral dimensions of L and W. With one suitable arrangement, L may be about 80 mm (e.g., 50-110 mm) and W may be about 15 mm (e.g., about 5-25 mm).

Capacitor 124 may be coupled between housing 12 (e.g., the antenna ground) and parasitic antenna resonating element 66 using capacitor terminals 126 and 128. The capacitance of capacitor 124 may be selected to provide sufficient coupling between terminal 126 and terminal 128 and therefore housing 12 and element 66 at the operating frequencies of antenna 26 (e.g., at 850-2100 MHz, as an example). For example, the capacitance of capacitors such as capacitor 124 may be about 1-5 pF (i.e., less than 100 pF).

Parasitic antenna resonating element 66 may serve as part of a capacitive proximity sensor. With this type of arrangement, element 66 may serve to transmit and receive radio-frequency signals (e.g., at signals frequencies of 850 MHz and above), while simultaneously serving as a capacitor electrode at lower frequencies (e.g., at frequencies of about 200-250 kHz, at frequencies below 1 MHz, or other suitable frequencies). At these lower frequencies, the circuitry of proximity sensor 80 (FIG. 5) may detect changes in capacitance as an external object nears the capacitor electrode.

Figure 9:
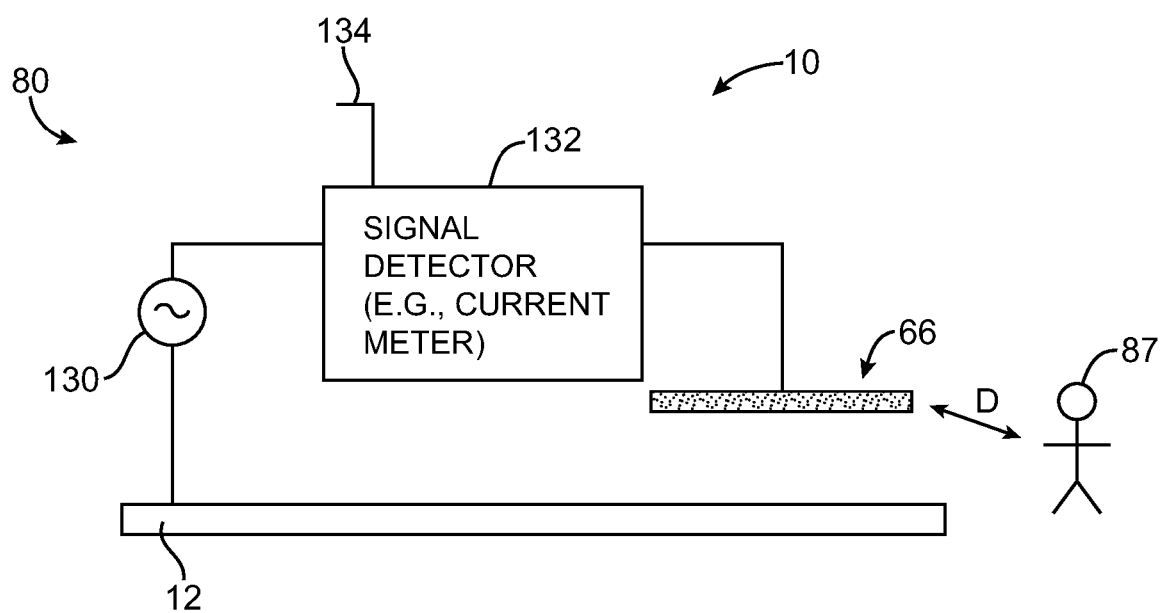
FIG. 9 is a diagram showing how a proximity sensor may have a capacitor electrode for detecting the presence of external objects such as a part of a user's body in accordance with an embodiment of the present invention.

An illustrative capacitive proximity sensor arrangement that may be used for proximity sensor 80 of FIG. 5 is shown in FIG. 9. As shown in FIG. 9, proximity sensor 80 may include control circuitry such as signal generator 130 and signal detector 132. Conductive element 66 may serve as an electrode for proximity sensor 80. Signal generator 130 may be, for example, a voltage source that produces an alternating current (AC) signal at a frequency of about 200-250 kHz (as an example). Signal detector 132 may be a current meter or other suitable measurement circuit for monitoring signals associated with capacitor electrode 66.

During operation, signal detector 132 can monitor the capacitance associated with electrode 66. When a user's leg or other external object 87 comes within range of electrode 66, the presence of the external object will create a change in capacitance that can be detected by signal detector 132. Signal detector 132 can provide an output signal on line 134 that is indicative of the presence or absence of external object 87 in the vicinity of electrode 66. This signal, which may be provided in analog or digital form, may be a Boolean value that has a first logic value (e.g., a logic zero) when external object 87 is not detected and that has a second logic value (e.g., a logic one) when external object 87 is detected.

The output signal on line 134 may also have a level that varies continuously in response to different detected capacitance changes. With this type of arrangement, proximity detector 80 may estimate the value of the distance D that separates electrode 66 from external object 87. When object 87 is close, the proximity detector will produce a relatively high value on output 134. When object 87 is far, the proximity detector will produce a relatively low value on output 134. The signal on output 134 may be an analog signal (e.g., an analog voltage) or a digital value.

The output signal on path 134 may be fully processed (e.g., to indicate the value of D) or may be a raw signal (e.g., a signal that represents the detected capacitance value from electrode 66). Raw signals may be processed further using storage and processing circuitry 16. Other arrangements may be used if desired. For example, other signal sources may be used, other signal detecting schemes may be used, signal outputs may be provided using a combination of analog and digital signals, etc.

Sensor electrode 66 may be formed from any suitable conductive structures that can detect capacitance changes due to the presence of an external object such as a human body part. The shape of electrode 66 when viewed from the top may have straight sides, curved sides, mixtures of straight and curve sides, or other suitable shapes. For example, electrode 66 may have a rectangular outline. The dimensions of electrode 66 may be such that the outline of electrode 66 fits within the outline of dielectric antenna window 58, as shown in FIG. 8. In cross-section, the thickness of electrode 88 may be less than 1 mm, less than 0.5 mm, less than 0.2 mm, less than 0.1 mm, or any other suitable thickness. Substrates such as rigid and flexible printed circuit board substrates may be used in forming electrode 66. Electrode 66 may also be formed from metal foil or other conductive materials.

Electrode 66 may be formed from a single layer of conductive material or two or more layers of conductive material. For example, electrode 66 may be formed from a flex circuit substrate or other printed circuit board substrate having an upper conductive layer and a lower conductive layer. The upper and lower layers may be, for example, rectangular conductive traces formed on a flex circuit or rigid printed circuit board substrate. The conductive traces may be formed from a metal such as copper.

With this type of two layer arrangement, one of the electrode layers may serve as a sensor electrode layer and the other of the electrode layers may serve as an active shield layer. An illustrative arrangement of this type is shown in FIG. 10.

Figure 10:
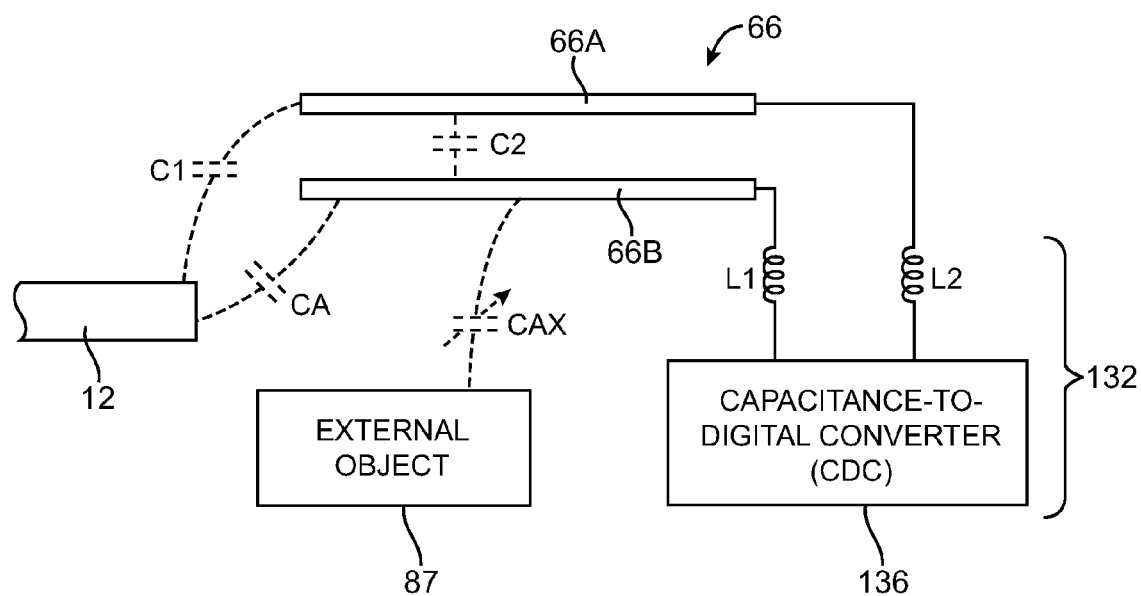
FIG. 10 is a diagram showing how a capacitive proximity sensor may have a two-layer capacitive sensor having a shield electrode and a sensor electrode that are monitored by a capacitance-to-digital converter in accordance with an embodiment of the present invention.

As shown in FIG. 10, sensor electrode 66 may have upper layer 66A and lower layer 66B. Lower layer 66B may be a sensor electrode layer (sometimes referred to as a sensor electrode). Upper layer 66A may be an active shield layer (sometimes referred to as an alternating current shield or AC shield).

Capacitances that are associated with a capacitive sensor configuration that uses a two-layer sensor electrode are showing in FIG. 10. The conductive layers in sensor electrode 66 may be coupled to signal detector 132. In the example of FIG. 10, signal detector 132 includes a capacitance-to-digital converter (CDC) 136 that is connected to electrode layers 66A and 66B through respective inductors L2 and L1. Inductors L1 and L2 may have inductance values of about 220-390 nH (e.g., 390 nH) or other suitable values that allow inductors L1 and L2 to serve as radio-frequency chokes (i.e., radio-frequency choke inductors). Radio-frequency signals that are transmitted by antenna resonating element 68 can be electromagnetically coupled into the conductive structures of sensor electrode 66. When the inductance values of L1 and L2 are selected properly, these radio-frequency signals are subject to a relatively high impedance and are not passed to capacitance-to-digital converter 135. At the same time that radio-frequency signals from antenna resonating element 68 are being blocked by inductors L1 and L2 (which serve as radio-frequency chokes), lower frequency signals such as alternating current (AC) excitation signals in the kHz range that are supplied to sensor electrode 66 by source 130 (FIG. 9) can pass from sensor electrode 66 to capacitance-to-digital converter through inductors L1 and L2. This is because the impedances of inductors L1 and L2 scale with frequency.

Capacitance-to-digital converter 136 may be implemented using any suitable capacitive touch sensor control circuit.

With one suitable arrangement, capacitance-to-digital converter 136 may be implemented using the AD7147 programmable capacitance-to-digital converter integrated circuit available from Analog Devices of Norwood, Mass. Capacitance-to-digital converter 136 converts a capacitive input signal on its input to a digital capacitance value on its output.

During operation, the measured capacitance C2 between conductive electrode layers 66A and 66B can be minimized by driving signals onto conductors 66A and 66B in parallel. This helps to improve sensor performance. There is typically a fixed capacitance C1 of about 150 pF or less between sensor electrode 66A and housing 12. Capacitance C1 arises from electromagnetic fields within housing 12 and is not responsive to changes in the position of external object 87 with respect to electrode 66. Fringing electric fields outside of housing 12 give rise to a capacitance CA between conductive layer 66B and housing 12. Variable capacitance CAX arises between external object 87 and conductive layer 66B. The magnitude of capacitance CAX depends on the distance between external object 87 and electrode layer 66B. When external object 87 is not present, the value of CAX is at a minimum. As object 87 approaches layer 66B, the value of CAX rises. Relatively large values of CAX arise when object 87 is in the vicinity of layer 66B (i.e., when object 87 is less than 2 cm or other suitable distance from layer 66B. Capacitance-to-digital converter 136 can measure capacitance CAX (which is in parallel with capacitance CA) and can produce a corresponding digital capacitance value. Storage and processing circuitry 16 (FIG. 3) may receive the digital capacitance value that has been measured by capacitance-to-digital converter 136 and can compute a corresponding distance value that is indicative of the distance of external object from sensor electrode 66.

When external object 87 is in proximity to sensor electrode 66 (e.g., when a user places device 10 on the user's lap so that antenna resonating element 68 and other structures in antenna 26 are close to the user's leg), capacitance-to-digital converter (CDC) 136 can output a correspondingly high capacitance value. Storage and processing circuitry 16 can analyze the capacitance signal from capacitance-to-digital converter 136 and can take appropriate action.

For example, if storage and processing circuitry 16 concludes that external object 87 is more than 2 cm (or other suitable distance) from antenna resonating element 68 and other such antenna structures in device 10, transceiver circuitry 23 can be allowed to transmit radio-frequency antenna signals at any desired power including the maximum available transmit power for device 10. If, however, storage and processing circuitry 16 concludes that external object 87 is in the vicinity of antenna 26, storage and processing circuitry 16 can limit the amount of permissible transmit power from transceivers 23. In this way, storage and processing circuitry 16 can use external object proximity information in determining what radio-frequency output power level to use in operating transceiver circuitry 23. When an external object such as a user's body is close to device 10 and antenna 26, the maximum transmit power can be reduced to ensure compliance with regulatory limits. When no external object is in the vicinity of device 10 and antenna 26, proximity-based transmit power limits may be removed and larger radio-frequency output powers can be used.

Figure 11:
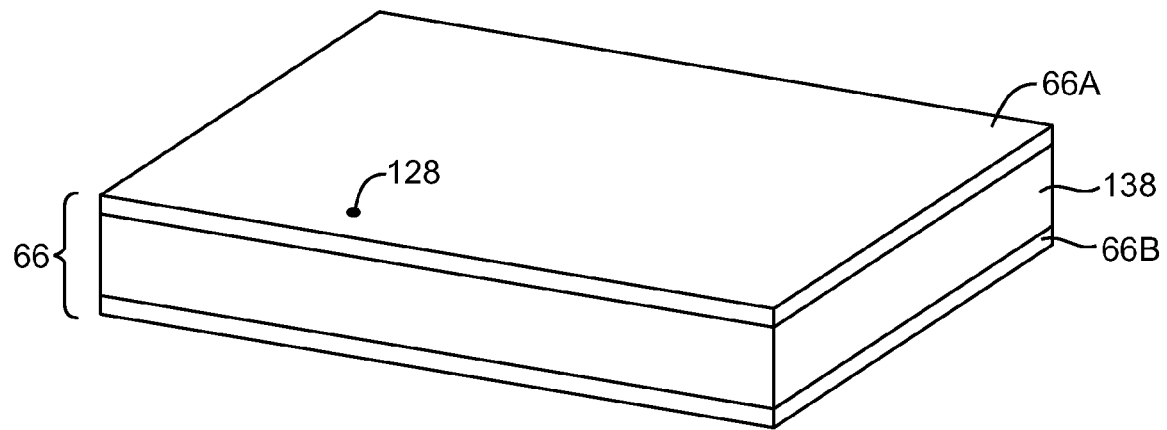
FIG. 11 is a perspective view of an illustrative two-layer capacitive proximity sensor electrode structure in accordance with an embodiment of the present invention.
Figure 12:
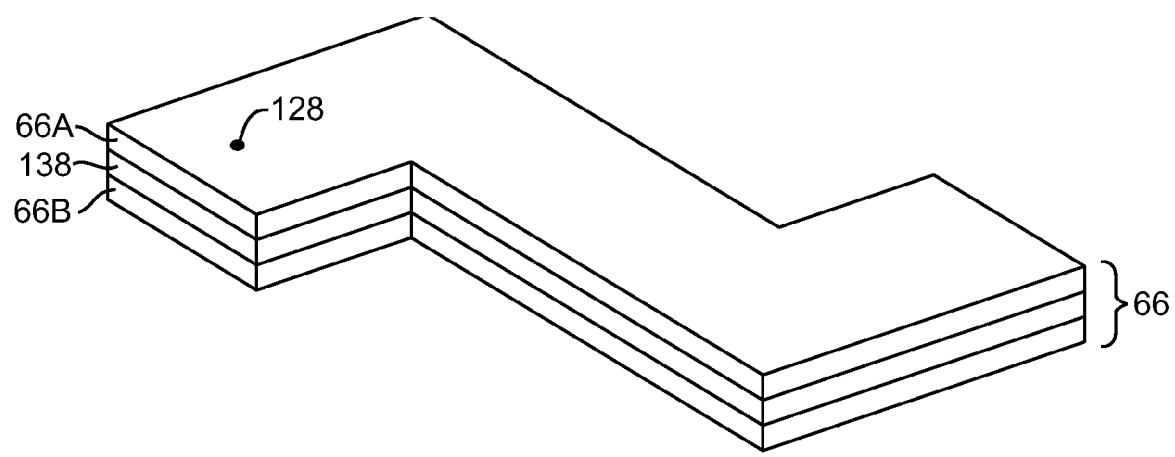
FIG. 12 is a perspective view of an elongated two-layer capacitive proximity sensor electrode in accordance with an embodiment of the present invention.

Illustrative configurations that may be used for a two-layer sensor electrode are shown in FIGS. 11 and 12. As shown in FIG. 11, capacitive sensor electrode 66 may have conductive layers 66A and 66B that are formed from conductive traces on opposing sides of dielectric substrate 138. The outline of layers 66A and 66B may be rectangular (as shown in FIG. 11) or may have other suitable shapes. Capacitor 124 (FIG. 8) may be connected to layer 66A at terminal 128 (as an example). Dielectric substrate 138 may be plastic, epoxy (e.g., fiberglass-filled epoxy such as FR4 or other rigid printed circuit board dielectrics), or a flexible polymer sheet (e.g., a polyimide layer for a flex circuit). Conductive layers 66A and 66B may be formed by physical vapor deposition, electroplating, screen printing, or any other suitable layer formation technique. Layers 66A and 66B may be less than 0.1 mm thick, less than 0.05 mm thick, less than 0.01 mm thick, etc. Dielectric substrate layer 138 may be less than 1 mm thick, less than 0.5 mm thick, less than 0.1 mm thick, less than 0.05 mm thick, etc.

In the illustrative layout of FIG. 11, sensor electrode 66 has a substantially rectangular outline. If desired, sensor electrode 66 may have non-rectangular shapes. As shown in FIG. 12, for example, sensor electrode 66 may have an elongated shape with one or more bends. In FIG. 12, sensor electrode 66 has three layers: conductive layer 66A, dielectric layer 138, and conductive layer 66B. If desired, electrode 66 may have more layers or fewer layers. Layers 66A and 66B may be metal layers or layers of other suitable conductive materials, as described in connection with FIG. 11. Layer 138 may be a printed circuit board substrate such as a rigid printed circuit board or a flex circuit substrate. As with dielectric substrate layer 138 of FIG. 11, typical thicknesses that may be used for substrate 138 are less than 1 mm. For example, dielectric layer 138 may be less than 0.5 mm thick, less than 0.1 mm thick, less than 0.05 mm thick, etc.

The layouts of FIGS. 11 and 12 are merely illustrative. Any suitable sensor electrode layout may be used if desired. Sensor electrode 66 may, for example, have elongated shapes, shapes with straight sides, shapes with curved sides, etc. Single-layer arrangements and multi-layer arrangements may be used. As described in connection with FIGS. 6-8, sensor electrode 66 may serve as a parasitic antenna resonating element that reduces radio-frequency hotspots in the electromagnetic radiation emitted by device 10. This may help ensure that device 10 satisfies regulatory limits for radio-frequency signal transmission powers, particularly through the lower portion of device 10 where device 10 may come into contact with an external object such as the human body.

The foregoing is merely illustrative of the principles of this invention and various modifications can be made by those skilled in the art without departing from the scope and spirit of the invention.

What is claimed is:

1. An electronic device, comprising:
    a housing;
    an antenna window in the housing;
    an antenna resonating element mounted in the housing so that radio-frequency signals are transmitted through the antenna window;
    a capacitive proximity sensor electrode located between the antenna resonating element and the antenna window;
    a capacitance-to-digital converter having first and second inputs; and
    first and second radio-frequency choke inductors coupled between the capacitive proximity sensor electrode and the capacitance-to-digital converter.

2. The electronic device defined in claim 1 wherein the capacitive proximity sensor comprises:
    a dielectric layer; and
    first and second conductive layers on opposing sides of the dielectric layer.

3. The electronic device defined in claim 2 wherein the dielectric layer comprises a flexible sheet of polymer.

4. The electronic device defined in claim 3 wherein the first and second conductive layers comprise rectangles of metal.

5. The electronic device defined in claim 2 wherein the dielectric layer comprises a rigid printed circuit board substrate.

6. The electronic device defined in claim 2 wherein the housing comprises a conductive housing, the electronic device further comprising a capacitor connected between first conductive layer and the conductive housing.

7. The electronic device defined in claim 2 wherein the conductive housing comprises a metal housing, the electronic device further comprising:
   a positive antenna feed terminal connected to the antenna resonating element;
   a ground antenna feed terminal connected to the metal housing; and
   a capacitor connected between the metal housing and the capacitive proximity sensor electrode, wherein the capacitive proximity sensor electrode serves as a parasitic antenna resonating element.

8. The electronic device defined in claim 7 wherein the electronic device has front and rear surfaces, the electronic device further comprising a display on the front surface of the electronic device, wherein the display has an inactive region through which radio-frequency signals are transmitted from the antenna resonating element.

9. The electronic device defined in claim 7 further comprising ferrite tape between the capacitive proximity sensor electrode and the antenna window.

10. The electronic device defined in claim 1 wherein the capacitive proximity sensor electrode comprises:
    a dielectric layer; and
    first and second conductive layers on opposing sides of the dielectric layer, wherein the first conductive layer is connected to the first input by the first radio-frequency choke inductor and wherein the second conductive layer is connected to the second input by the second radio-frequency choke inductor.

11. The electronic device defined in claim 10 further comprising a display having display panel circuitry that is covered by a transparent dielectric cover member, wherein the antenna resonating element emits radio-frequency signals that pass through the transparent dielectric cover member without passing through the display panel circuitry.

12. A tablet computer comprising:
    a conductive housing;
    a dielectric antenna window in the conductive housing;
    radio-frequency transceiver circuitry;
    an antenna with which the radio-frequency transceiver circuitry transmits radio-frequency signals in at least one cellular telephone band, wherein the antenna comprises an antenna ground formed from at least portion of the conductive housing and an antenna resonating element mounted adjacent to the dielectric antenna window;
    a capacitive proximity sensor electrode mounted between the antenna resonating element and the dielectric antenna window; and
    a capacitance-to-digital converter coupled to the capacitive proximity sensor electrode.

13. The tablet computer defined in claim 12 wherein the capacitive proximity sensor comprises first and second conductive layers separated by a dielectric layer.

14. The tablet computer defined in claim 13 further comprising a pair of inductors coupled between the capacitive proximity sensor electrode and the capacitance-to-digital converter.

15. The tablet computer defined in claim 12 further comprising a capacitor having a first terminal connected to the conductive housing and a second terminal connected to the capacitive proximity sensor electrode, wherein the capacitive proximity sensor electrode serves as a parasitic antenna resonating element for the antenna.

16. An electronic device comprising:
    at least one conductive housing structure to which a ground antenna feed terminal is connected;
    an antenna window in the housing structure;
    an antenna resonating element formed from conductive traces on a flex circuit to which a positive antenna feed terminal is connected;
    radio-frequency transceiver circuitry that is coupled to the positive antenna feed terminal and the ground antenna feed terminal and that transmits radio-frequency signals through the antenna window using the antenna resonating element; and
    a capacitive proximity sensor electrode interposed between the antenna resonating element and the antenna window, wherein the radio-frequency transceiver circuitry transmits the radio-frequency signals at an output power; and
    circuitry coupled to the capacitive proximity sensor electrode that limits the output power when an external object is detected within a given distance of the capacitive proximity sensor electrode.

17. The electronic device defined in claim 16 wherein the capacitive proximity sensor electrode comprises first and second conductive layers coupled to the circuitry by respective first and second inductors and wherein the circuitry comprises a capacitance-to-digital converter that makes capacitance measurements on the capacitive proximity sensor electrode.

18. The electronic device defined in claim 16 wherein the capacitive proximity sensor electrode serves as a parasitic antenna resonating element, the electronic device further comprising a capacitor connected between the conductive housing structure and the capacitive proximity sensor electrode.

19. The electronic device defined in claim 18 wherein the capacitive proximity sensor comprises first and second conductive layers separated by a dielectric substrate.

* * * * *

UNITED STATES PATENT AND TRADEMARK OFFICE
CERTIFICATE OF CORRECTION

PATENT NO. : 8,432,322 B2
APPLICATION NO. : 12/632695
DATED : April 30, 2013
INVENTOR(S) : David T. Amm et al.

Page 1 of 1

It is certified that error appears in the above-identified patent and that said Letters Patent is hereby corrected as shown below:

On the Title Page:

Page 2, column 2, under item (56), Other Publications line 15, delete "Palace, Aleksander, et al. U.S. Appl. No. 12/861,640, filed Aug. 23, 2010." and insert -- Pance, Aleksander, et al. U.S. Appl. No. 12/861,640, filed Aug. 23, 2010. --

Page 2, column 2, under item (56), Other Publications line 17, delete "Palace, Aleksander, et al. U.S. Appl. No. 61/235,905, filed Aug. 21, 2009." and insert -- Pance, Aleksander, et al. U.S. Appl. No. 61/235,905, filed Aug. 21, 2009. --

Page 2, column 2, under item (56), Other Publications line 18, delete "Leung, Omar S. et al. U.S. Appl. No. 12/257,956, filed Oct. 24, 2006." and insert -- Leung, Omar S. et al. U.S. Appl. No. 12/257,956, filed Oct. 24, 2008. --

In the Claims:

In claim 6, column 15, lines 8-9, delete "a capacitor connected between first conductive layer" and insert -- a capacitor connected between the first conductive layer --

In claim 12, column 15, line 52, delete "formed from at least portion" and insert -- formed from at least a portion --

Signed and Sealed this
Eighteenth Day of March, 2014

Michelle K. Lee
*Deputy Director of the United States Patent and Trademark Office*